(12) United States Patent
Baum et al.

(10) Patent No.: US 8,869,008 B2
(45) Date of Patent: Oct. 21, 2014

(54) ADAPTATION OF ANALOG MEMORY CELL READ THRESHOLDS USING PARTIAL ECC SYNDROMES

(71) Applicant: Apple Inc., Cupertino, CA (US)

(72) Inventors: Barak Baum, Givatayim (IL); Micha Anholt, Tel-Aviv (IL)

(73) Assignee: Apple Inc., Cupertino, CA (US)

( * ) Notice: Subject to any disclaimer, the term of this patent is extended or adjusted under 35 U.S.C. 154(b) by 101 days.

(21) Appl. No.: 13/743,721

(22) Filed: Jan. 17, 2013

(65) Prior Publication Data

US 2014/0201596 A1    Jul. 17, 2014

(51) Int. Cl.
G11C 29/00 (2006.01)
G06F 11/10 (2006.01)
H03M 13/15 (2006.01)

(52) U.S. Cl.
CPC ........ *G06F 11/1008* (2013.01); *G06F 11/1076* (2013.01); *H03M 13/1515* (2013.01); *G06F 11/1068* (2013.01); *H03M 13/1545* (2013.10)
USPC ............................ 714/773; 714/784; 714/785

(58) Field of Classification Search
CPC .......................... H03M 13/151; G06F 11/1008
USPC .......................................... 714/785, 784, 773
See application file for complete search history.

(56) References Cited

U.S. PATENT DOCUMENTS

| | | | |
|---|---|---|---|
| 7,392,456 B2 | 6/2008 | Leung et al. | |
| 8,145,984 B2 * | 3/2012 | Sommer et al. | 714/797 |
| 8,156,398 B2 | 4/2012 | Sommer | |
| 8,166,371 B2 * | 4/2012 | Shimizume et al. | 714/773 |
| 8,230,309 B2 * | 7/2012 | Ito | 714/794 |
| 8,291,297 B2 * | 10/2012 | Coulson et al. | 714/764 |
| 8,418,021 B2 | 4/2013 | Lin et al. | |
| 8,510,628 B2 * | 8/2013 | Bedeschi et al. | 714/763 |
| 2014/0095958 A1 | 4/2014 | Kwok | |

OTHER PUBLICATIONS

"Introduction to Flash Memory", Roberto Bez, et al., Proceedings of the IEEE, vol. 91, No. 4, Apr. 2003, pp. 489-502.
"Program Schemes for Multilevel Flash Memories", Marco Grossi, et al., Proceedings of the IEEE, vol. 91, No. 4, Apr. 2003, pp. 594-601.
"Status and Outlook of Emerging Nonvolatile Memory Technologies", Gerhard Muller, et al., 2004, pp. 23.1.1-23.1.4.
"Ballistic Electron Transport in Thin Silicon Dioxide Films", M.V. Fischetti, et al., The American Physical Society, 1987, pp. 4404-4415.

(Continued)

*Primary Examiner* — Esaw Abraham
(74) *Attorney, Agent, or Firm* — Meyertons, Hood, Kivlin, Kowert & Goetzel, P.C.

(57) ABSTRACT

A method includes storing data that is encoded with an Error Correction Code (ECC) in a group of analog memory cells. The memory cells in the group are read using multiple sets of read thresholds. The memory cells in the group are divided into two or more subsets. N partial syndromes of the ECC are computed, each partial syndrome computed over readout results that were read using a respective set of the read thresholds from a respective subset of the memory cells. For each possible N-bit combination of N bit values at corresponding bit positions in the N partial syndromes, a respective count of the bit positions in which the combination occurs is determined, so as to produce a plurality of counts. An optimal set of read thresholds is calculated based on the counts, and data recovery is performed using the optimal read thresholds.

18 Claims, 4 Drawing Sheets

(56) References Cited

OTHER PUBLICATIONS

"Scaling of Flash NVRAM to 10's of nm by Decoupling of Storage From Read/Sense Using Back-Floating Gates", Arvind Kumar, Sandip Tiwari, IEEE Transactions on Nanotechnology, vol. 1 No. 4 Dec. 2002, pp. 247-254.

"Investigation of Channel Hot Electron Injection by Localized Charge-Trapping Nonvolatile Memory Devices" Eli Lusky, et al., IEEE Transactions on Electron Devices, vol. 51, No. 3, Mar. 2004, pp. 444-451.

"110nm NROM Technology for Code and Data Flash Products", Josef Willer, et al., 2004 Symposium on VLSI Technology Digest of Technical Papers, pp. 76-77.

"Data Retention Reliability Model of NROM Nonvolatile Memory Products", Meir Janai, et al., 2004, pp. 1-13.

"A Nanoscale Memory and Transistor Using Backside Trapping", Helena Silva and Sandip Tiwari IEEE Transactions on Nanotechnology, vol. 3, No. 2, Jun. 2004, pp. 264-269.

"A Universal semiempirical model for the Fowler-Nordheim programming of charge trapping devices", Ravishankar Sundararaman and Sandip Tiwari, Jan. 14, 2010, pp. 1-3.

"Can NROM, a 2-bit, Trapping Storage NVM Cell, Give a Real Challenge to Floating Gate Cells?", Boaz Eitan, et al., Saifun Semiconductors, 1999, pp. 1-3.

"Multilevel Flash Cells and their Trade-offs", Boaz Eitan, et al., 1996, pp. 7.1.1-7.1.4.

"Future Memory Technology including Emerging New Memories", Kinam Kim and Gwan-Hyeob Koh, International Conference on Microelectronics, vol. 1, May 16-19, 2004, pp. 377-384.

"A 512Mb NROM Flash Data Storage Memory with 8MB/s Data Rate", Eduardo Maayan, et al., 2002 IEEE International Solid-State Circuits Conference, pp. 1-2.

\* cited by examiner

ADAPTATION OF ANALOG MEMORY CELL READ THRESHOLDS USING PARTIAL ECC SYNDROMES

CROSS-REFERENCE TO RELATED APPLICATIONS

This application is related to U.S. patent application Ser. No. 13/595,571, filed Aug. 27, 2012, whose disclosure is incorporated herein by reference.

FIELD OF THE INVENTION

The present invention relates generally to memory devices, and particularly to methods and systems for setting thresholds for reading analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as analog storage values or analog values. In Flash memories, for example, each analog memory cell holds a certain amount of electrical charge. The range of possible analog values is typically divided into regions, each region corresponding to a programming state or programming level that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Various techniques for setting read thresholds and other read parameters for reading analog memory cells are known in the art. For example, U.S. Pat. No. 8,156,398, whose disclosure is incorporated herein by reference, describes a method for operating a memory that includes analog memory cells. The method includes encoding data with an Error Correction Code (ECC) that is representable by a plurality of equations. The encoded data is stored in a group of the analog memory cells by writing respective input storage values to the memory cells in the group. Multiple sets of output storage values are read from the memory cells in the group using one or more different, respective read parameters for each set. Numbers of the equations, which are satisfied by the respective sets of the output storage values, are determined. A preferred setting of the read parameters is identified responsively to the respective numbers of the satisfied equations. The memory is operated on using the preferred setting of the read parameters.

SUMMARY OF THE INVENTION

An embodiment of the present invention that is described herein provides a method including storing data that is encoded with an Error Correction Code (ECC) in a group of analog memory cells. The memory cells in the group are read using multiple sets of read thresholds. The memory cells in the group are divided into two or more subsets. N partial syndromes of the ECC are computed, each partial syndrome computed over readout results that were read using a respective set of the read thresholds from a respective subset of the memory cells. For each possible N-bit combination of N bit values at corresponding bit positions in the N partial syndromes, a respective count of the bit positions in which the combination occurs is determined, so as to produce a plurality of counts. An optimal set of read thresholds is calculated based on the counts, and data recovery is performed using the optimal read thresholds.

In some embodiments, calculating the optimal set of read thresholds includes calculating, using the counts, sums of different respective combinations of the partial syndromes, identifying a sum containing a minimal number of "1" bit values, and selecting the optimal read thresholds corresponding to the partial syndromes in the identified sum. In an embodiment, calculating the sums includes, for a given sum, identifying the N-bit combinations of the bit values of the partial syndromes that contribute to the number of "1" bit values in the given sum, and summing the counts corresponding to the identified combinations.

In a disclosed embodiment, computing the partial syndromes includes storing the partial syndromes in a syndrome memory, and determining the counts and calculating the optimal set include reading each partial syndrome from the syndrome memory only once. In another embodiment, determining the counts includes producing relative partial syndromes that include bit-wise XORs of pairs of the partial syndromes, and determining the counts for respective combinations of bits of the relative partial syndromes.

In yet another embodiment, computing the partial syndromes includes computing, directly from the readout results, relative partial syndromes that include bit-wise XORs of pairs of the partial syndromes. In still another embodiment, computing the N partial syndromes includes operating one or more shift units for performing logical shift operations, followed by one or more XOR units for performing XOR operations. Operating the shift units and the XOR units may include calculating the N partial symbols using less than N shift units operating in parallel.

There is additionally provided, in accordance with an embodiment of the present invention, apparatus including a memory and storage circuitry. The memory includes analog memory cells. The storage circuitry is configured to store data that is encoded with an Error Correction Code (ECC) in a group of the analog memory cells, to read the memory cells in the group using multiple sets of read thresholds, to divide the memory cells in the group into two or more subsets, to compute N partial syndromes of the ECC, each partial syndrome computed over readout results that were read using a respective set of the read thresholds from a respective subset of the memory cells, to determine, for each possible N-bit combination of N bit values at corresponding bit positions in the N partial syndromes, a respective count of the bit positions in which the combination occurs, so as to produce a plurality of counts, to calculate an optimal set of read thresholds based on the counts, and to perform data recovery using the optimal read thresholds.

There is also provided, in accordance with an embodiment of the present invention, apparatus including an interface and storage circuitry. The interface is configured to communicate with a memory that includes analog memory cells. The storage circuitry is configured to store data that is encoded with an Error Correction Code (ECC) in a group of the analog memory cells, to read the memory cells in the group using multiple sets of read thresholds, to divide the memory cells in the group into two or more subsets, to compute N partial syndromes of the ECC, each partial syndrome computed over readout results that were read using a respective set of the read thresholds from a respective subset of the memory cells, to determine, for each possible N-bit combination of N bit values at corresponding bit positions in the N partial syndromes, a respective count of the bit positions in which the combination occurs, so as to produce a plurality of counts, to calculate an optimal set of read thresholds based on the counts, and to perform data recovery using the optimal read thresholds.

The present invention will be more fully understood from the following detailed description of the embodiments thereof, taken together with the drawings in which:

DETAILED DESCRIPTION OF EMBODIMENTS

Overview

Figure 1:
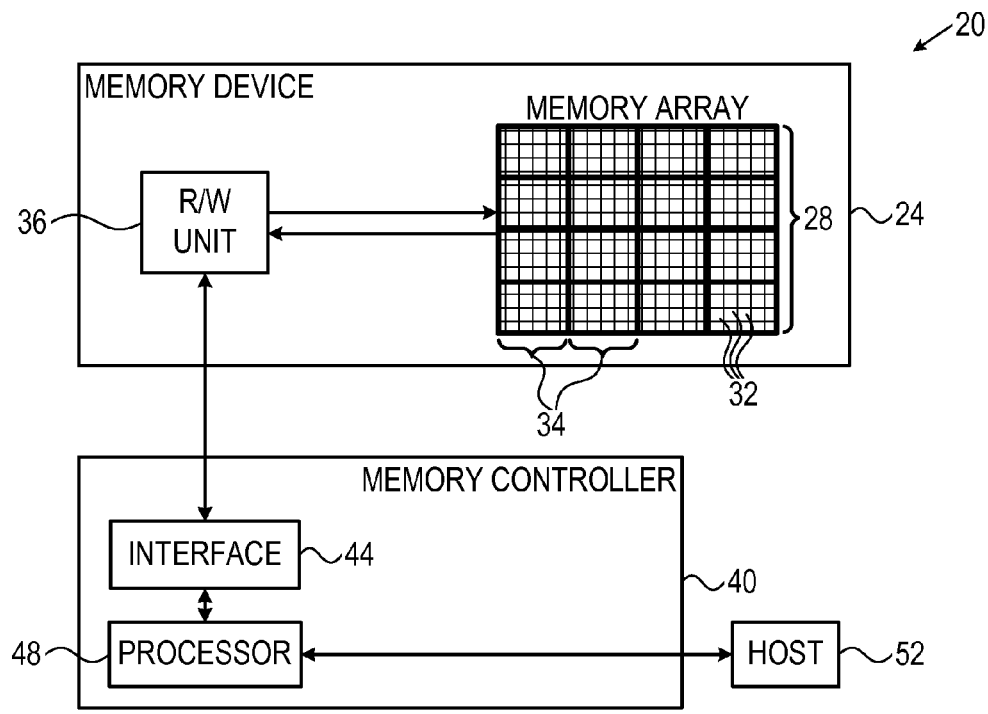
FIG. 1 is a block diagram that schematically illustrates a memory system, in accordance with an embodiment of the present invention.

Data is typically stored in analog memory cells by writing into the cells respective analog storage values that represent the data. The range of analog storage values is typically divided into regions, referred to as programming levels, which represent the possible data values. The analog memory cells are typically read by comparing their analog storage values to certain read thresholds that are positioned at the boundaries between adjacent programming levels.

In many practical cases, the analog storage values of the memory cells vary over time and from one memory cell group to another. Therefore, it is important to track and position the read thresholds with high accuracy. Accurate positioning of read thresholds has a considerable impact on the probability of read errors.

On the other hand, evaluation of multiple sets of read thresholds may incur considerable latency and power consumption, for example because this task involves a large number of read operations from the memory cells. The evaluation of read thresholds becomes particularly complex when using high-order MLC that store large numbers of bit per cell.

Embodiments of the present invention that are described herein provide improved methods and systems for evaluating read thresholds. In the disclosed embodiments, a memory controller stores data in analog memory cells. The memory controller evaluates the readout performance of multiple sets of read thresholds, while actually reading the memory cells using only a small fraction of these sets. The readout performance of the remaining sets of read thresholds is evaluated by computation, without actually reading the memory cells.

The sets of read thresholds that are used for reading the memory cells are referred to herein as explicit sets, and the sets of read thresholds whose performance is evaluated by computation are referred to herein as hybrid sets. The best-performing set of read thresholds (explicit or hybrid) is selected as the optimal set and used for subsequent data readout.

The disclosed techniques evaluate the performance of multiple threshold sets while actually reading the memory cells using only a small fraction of the sets. As a result, the latency and power consumption incurred by the threshold evaluation process is reduced considerably.

In some embodiments, the data stored in a group of memory cells is encoded with an Error Correction Code (ECC), for example a Low Density Parity Check (LDPC) code. The memory controller reads the memory cells in the group using multiple explicit sets of read thresholds. In addition, the memory controller divides the group of memory cells is into subsets, based on the results of an auxiliary read operation or other suitable criterion.

The memory controller then computes a plurality of partial syndromes of the ECC. Each partial syndrome corresponds to a specific subset of the memory cells and to a specific explicit set of read thresholds: Each partial syndrome is produced by applying the parity check matrix of the ECC to the readout results obtained from the corresponding subset of memory cells using the corresponding set of read thresholds.

The readout performance of the various explicit and hybrid threshold sets can be evaluated by summing (modulo-2, i.e., XORing) appropriate combinations of the partial syndromes. The number of "1" bit values in such a sum is referred to as "syndrome sum." The syndrome sum indicates the number of ECC parity equations that are not satisfied by the readout results obtained with the corresponding set of thresholds (explicit or hybrid), and therefore indicates the readout performance of this threshold set. When using the above technique, the memory controller is able to discard the raw readout results after computing the partial syndromes. As a result, the threshold adaptation process can be implemented with modest memory requirements.

In some disclosed embodiments, instead of exhaustively summing the various combinations of partial syndromes, the memory controller constructs a histogram of bit-value combinations that occur in the partial syndromes. For a set of N partial syndromes, the histogram counts the occurrences of the possible N-bit combinations that occur in the different bit positions in the partial syndromes. The syndrome sum for each combination of partial syndromes is calculated by summing a predefined subset of the histogram bins. This technique enables the memory controller to read each partial syndrome only once, even though each partial syndrome participates in the calculations of multiple syndrome sums.

Additional embodiments that are described herein reduce the size of the histogram by half, by constructing the histogram from bit-value combinations in relative partial syndromes (bit-wise XORs between pairs of partial syndromes) instead of the partial syndromes themselves. The relative partial syndromes can be calculated from the partial syndromes, or directly from the readout results. Other disclosed embodiments provide efficient hardware schemes for calculating the partial syndromes.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes several example techniques for selecting and adapting read thresholds for reading the data stored in memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W circuitry in any suitable manner, or performed by any one of these elements. Thus, in the context of the present patent application and in the claims, memory controller 40 and R/W circuitry 36 are referred to jointly as storage circuitry that carries out the disclosed techniques.

Figure 2:
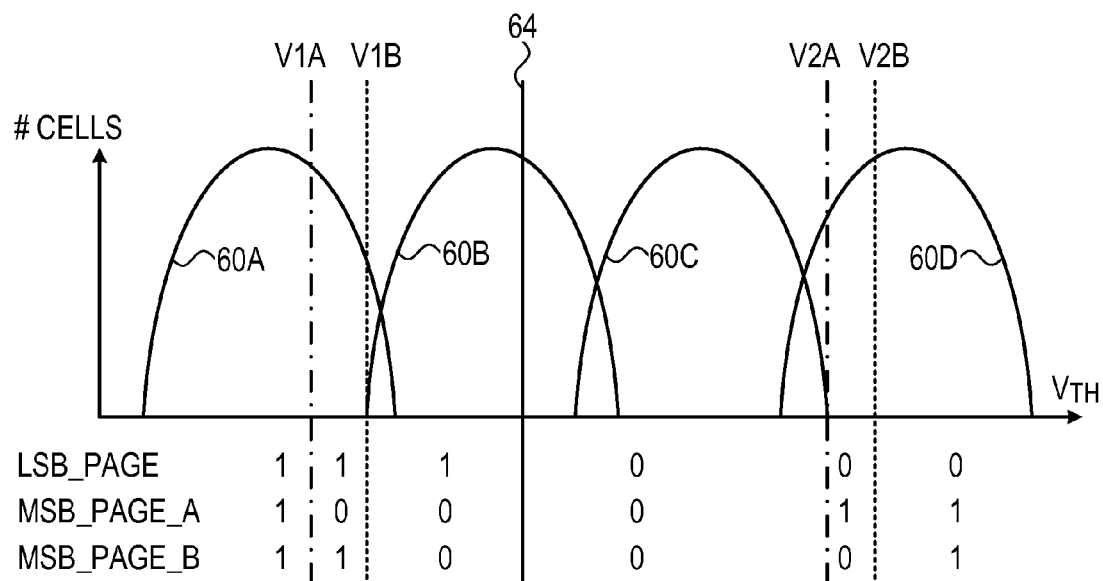
FIG. 2 is a diagram showing readout from a group of memory cells using multiple read threshold sets, in accordance with an embodiment of the present invention.

FIG. 2 is a diagram showing readout from a group of memory cells using multiple read threshold sets, in accordance with an embodiment of the present invention. In the present embodiment, memory cells 32 comprise four-level MLC, each holding two data bits. In alternative embodiments, the disclosed techniques can be used for selecting read thresholds for reading any other suitable type of MLC, such as eight-level or sixteen-level MLC.

In the example of FIG. 2, a group of memory cells, typically along a given word line, holds two data pages—A page referred to as Least Significant Bit (LSB) page in the first bit of the memory cells in the group, and another page referred to as Most Significant Bit (MSB) page in the second bit of the memory cells in the group.

The figure shows the threshold voltage ($V_{TH}$) distribution in the memory cells in the group. In this example, the threshold voltage is distributed in four distributions 60A ... 60D that correspond to four respective programming levels. Each programming level represents a respective combination of two bits—An LSB and an MSB:

TABLE 1

Example mapping of LSB and MSB to programming levels

| Programming level | LSB | MSB |
|---|---|---|
| 60A | 1 | 1 |
| 60B | 1 | 0 |
| 60C | 0 | 0 |
| 60D | 0 | 1 |

This mapping uses Gray coding, in which any two adjacent programming levels differ from one another by only a single bit value. Moreover, in this mapping the lowest two programming levels correspond to LSB="1", and the highest two programming levels correspond to LSB="0".

Typically, R/W unit 36 reads the LSB page by comparing the cell threshold voltages to an LSB read threshold 64. Memory cells whose threshold voltage falls below threshold 64 are regarded as holding LSB="1", and memory cells whose threshold voltage falls above threshold 64 are regarded as holding LSB="0".

Unit 36 typically reads the MSB page by comparing the cell threshold voltages to a pair of MSB read thresholds V1A and V2A, or to a pair of MSB read thresholds V1B and V2B. Memory cells whose threshold voltage falls between V1A and V2A (or between V1B and V2B) are regarded as holding MSB="0", and memory cells whose threshold voltage falls below threshold V1A or above threshold V2A (or, alternatively, below threshold V1B or above threshold V2B) are regarded as holding LSB="1".

In practice, the shapes and positions of distributions 60A ... 60D may vary over time and from one group of memory cells to another. Accurate positioning of the read thresholds has a considerable impact on the probability of read errors, especially when the programming level distributions are closely spaced or even partially overlapping. Since the boundary regions between distributions vary over time and between memory cell groups, the read threshold positions should typically be adjusted in an adaptive manner.

Explicit and Hybrid Sets of Read Thresholds

As can be seen in FIG. 2, each MSB readout operation involves comparison with a pair of read thresholds. In order to find the optimal positions of the MSB read thresholds, it is typically necessary to evaluate multiple candidate pairs of read thresholds and choose the best-performing pair.

An exhaustive search over multiple pairs of thresholds may involve a large number of readout operations in which the memory cell threshold voltages are sensed and compared to the thresholds of each pair, and may therefore incur considerable latency and power consumption. In some embodiments that are described herein, memory controller 40 evaluates the readout performance of multiple sets of read thresholds, while performing only a small number of read operations from memory cells 32. As a result, processing time and power consumption are reduced.

In the present example, the memory controller reads the memory cells in the group twice—Using the read threshold pair {V1A,V2A} and using the read threshold pair {V1B, V2B}. Based on the results of these two readout operations, the memory controller evaluates the readout performance of two additional pairs of read thresholds—{V1A,V2B} and {V1B,V2A}, without reading the memory cells using these read threshold pairs. Thus, the number of read operations is reduced by half in comparison with a conventional readout of {V1A,V2A}, {V1B,V2B}, {V1A,V2B} and {V1B,V2A}.

The sets of read thresholds with which the memory cells are actually read (pairs {V1A,V2A} and {V1B,V2B} in this example) are referred to herein as explicit sets of thresholds or simply explicit thresholds. The additional sets of thresholds (pairs {V1A,V2B} and {V1B,V2A} in this example), which are computed based on the explicit threshold, are referred to herein as hybrid sets of read thresholds, or hybrid thresholds for brevity.

After evaluating the readout performance of the various read threshold pairs, including the explicit thresholds and the hybrid thresholds, the memory controller selects the pair of read thresholds that exhibits the best readout performance. The selected pair of read thresholds (either explicit or hybrid) is used for data recovery—either from the same group of memory cells or from another group that is subject to similar conditions.

For a 2 bits/cell memory, the disclosed techniques can use the readout results of N read operations (N sets of explicit thresholds) to estimate the readout performance of $N^2$ pairs of read threshold combinations ($N^2$ sets of hybrid thresholds). When evaluating a larger number of threshold pairs, and/or when using higher-order MLC, the reduction in the number of read operations is considerably higher.

The example of FIG. 2 demonstrates the effectiveness of this technique. In this example, the two pairs of explicit thresholds ({V1A,V2A} and {V1B,V2B}) are not positioned optimally in the boundaries between the threshold voltage distributions. The hybrid pair {V1B,V2A}, however, is much better positioned. Even though the memory cells are never actually read using the hybrid pair {V1B,V2A}, the memory controller evaluates its readout performance from the readout results of the explicit threshold pairs {V1A,V2A} and {V1B,V2B}. The memory controller is then able to select the hybrid pair {V1B,V2A} for subsequent data recovery.

In the example of FIG. 2, memory controller 40 uses the readout results of the explicit pairs ({V1A,V2A} and {V1B,V2B}) to artificially construct the readout results of the hybrid pairs ({V1A,V2B} and {V1B,V2A}) without actually reading the memory cells using the hybrid pairs. Examples techniques for assessing the readout performance of the various explicit and hybrid sets of read thresholds, and for selecting the best-performing set, are described below.

Evaluating the Performance of Explicit and Hybrid Read Thresholds Using Partial ECC Syndromes In the embodiments described herein, processor 48 encodes the data stored in the group of memory cells with an Error Correction Code (ECC) that is defined by a set of parity check equations. The ECC may comprise, for example, a Low Density Parity Check (LDPC) code, or any other suitable type of ECC. For each set of read thresholds (explicit or hybrid), the memory controller calculates the number (count) of parity check equations that are satisfied by the readout results obtained using this set. The set of read thresholds (explicit or hybrid) that produces the readout results having the largest count of satisfied parity check equations is regarded as the best-performing set.

Additional aspects of setting read thresholds based on the number of satisfied parity check equations are addressed in U.S. Pat. No. 8,156,398, cited above. This criterion is also referred to as "syndrome sum." The term "syndrome sum" means the weight of the syndrome vector, i.e., the sum of locations where the syndrome is equal to 1 and not 0. Minimizing the syndrome sum is equivalent to finding the readout results having the largest number of satisfied parity check equations.

Note that in practice the syndrome sum may be a noisy criterion, and therefore it may not be accurate or appropriate to select the read thresholds having the minimal syndrome sum. In such cases, the read thresholds can be set by filtering or otherwise processing the syndrome sum of various readout results.

Consider a group of 2 bits/cell memory cells having four programming levels such as the one shown in FIG. 2 above, and assume that memory controller 40 reads the group using various explicit sets of MSB read thresholds. In some embodiments, instead of storing the entire vector of readout results for each set of explicit read thresholds, memory controller 40 computes and stores only two partial ECC syndromes for each explicit set.

Let H denote the parity check matrix of the ECC that is used for encoding the data stored in the group of memory cells, and let x denote a vector of MSB readout results using a certain explicit set of read thresholds. The full syndrome of x is defined as $s=H\cdot x$. If x is a valid ECC code word, then $s=H\cdot x=0$. Otherwise, the value of s is indicative of the number of parity check equations that are satisfied by x. Typically, the number of non-zero bits in the syndrome indicates the number of non-satisfied equations.

The two partial syndromes of readout results x are defined as $s_1=H\cdot x_1$ and $s_2=H\cdot x_2$, wherein $x_1$ denotes the vector of MSB values of the memory cells for which LSB="0" with the remaining bits nullified, and $x_2$ denotes the vector of MSB values of the memory cells for which LSB="1" with the remaining bits nullified. It can be shown that the sum of the partial syndromes is equal to the full syndrome, since $s=H\cdot x=H\cdot x_1+H\cdot x_2$.

Typically, for each vector x of readout results produced using a certain explicit set of read thresholds, memory controller 40 divides the memory cells in the group into two subsets—One subset for which LSB="0" and another subset for which LSB="1". The memory controller may divide the memory cells by reading the group with an LSB threshold such as threshold 64 in FIG. 2 above. Alternatively, the memory controller may divide the memory cells into the two subsets using an MSB read operation, or using any other suitable method.

Using this division, the memory controller generates vectors $x_1$ and $x_2$, and then computes the partial syndromes $s_1=H\cdot x_1$ and $s_2=H\cdot x_2$. At this stage, the memory controller may discard the raw read results (x, $x_1$ and $x_2$) and retain only the partial syndromes. This process is typically repeated for each explicit set of read thresholds.

The memory controller may use the stored partial syndromes to evaluate the full syndromes of various hybrid sets of read thresholds, which are formed using combinations of read thresholds from different explicit sets.

Consider, for example, two explicit MSB read operations, the first read operation using read thresholds {V1A,V2A} and the second read operation using read thresholds {V1B,V2B}. For the first read operation the memory controller computes and stores two partial syndromes denoted s1A and s2A. For the second read operation the memory controller computes and stores two partial syndromes denoted s1B and s2B. The memory controller can then compute the full syndrome for the hybrid set {V1A,V2B} by computing s1A+s2B. Similarly, the full syndrome for the hybrid set {V1B,V2A} is given by s1B+s2A.

Since the full syndrome (the sum of the partial syndromes) is indicative of the number of satisfied parity check equations, the memory controller may evaluate the readout performance of various (explicit or hybrid) sets of read thresholds by computing the respective full syndromes associated with these read thresholds. These full syndromes can be calculated by summing the appropriate partial syndromes that were computed for the explicit read thresholds.

In some embodiments, the memory controller selects the (explicit or hybrid) set of read thresholds having the smallest full syndrome sum. The selected set of read thresholds is then used for decoding the stored data. Alternatively, the memory controller may not necessarily select the set of read thresholds having the minimal syndrome sum, but rather apply some other processing (e.g., filtering) to the syndrome sums.

Storing of partial syndromes instead of raw readout results provides considerable saving in memory space. Since the syndrome length is comparable with the ECC redundancy size, it is typically on the order of 3-10% of the data page size.

Figure 3:
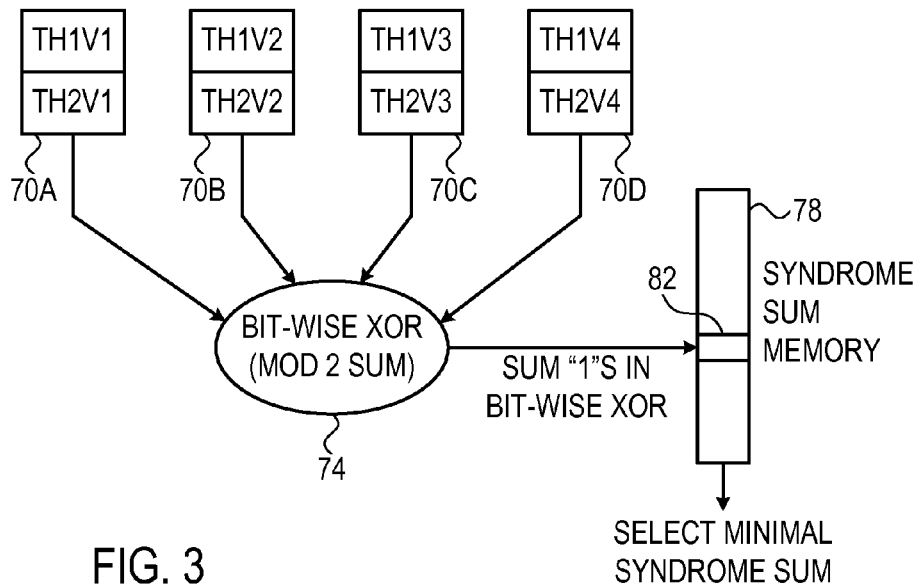
FIGS. 3 and 4 are diagrams that schematically illustrate processes for calculating optimal read thresholds, in accordance with embodiments of the present invention.

FIG. 3 is a diagram that schematically illustrates a process for calculating the optimal read thresholds, in accordance with an embodiment of the present invention. This example refers to a group of 3 bits/cell memory cells storing an LSB page, a Center Significance Bit (CSB) page and an MSB page using the following bit mapping and read threshold configuration:

TABLE 2

Example 3 bits/cell configuration

| Programmed pages | Data value | $V_{TH}$ range |
|---|---|---|
| LSB | "1" | $V_{TH} < RV_{11}$ |
|  | "0" | $V_{TH} > RV_{11}$ |
| LSB, CSB | "11" | $V_{TH} < RV_{21}$ |
|  | "10" | $RV_{21} < V_{TH} < RV_{22}$ |
|  | "00" | $RV_{22} < V_{TH} < RV_{23}$ |
|  | "01" | $V_{TH} > RV_{23}$ |
| LSB, CSB, MSB | "111" | $V_{TH} < RV_{31}$ |
|  | "110" | $RV_{31} < V_{TH} < RV_{32}$ |
|  | "100" | $RV_{32} < V_{TH} < RV_{33}$ |
|  | "101" | $RV_{33} < V_{TH} < RV_{34}$ |
|  | "001" | $RV_{34} < V_{TH} < RV_{35}$ |
|  | "000" | $RV_{35} < V_{TH} < RV_{36}$ |
|  | "010" | $RV_{36} < V_{TH} < RV_{37}$ |
|  | "011" | $V_{TH} > RV_{37}$ |

In such a configuration, the MSB page is read using a set of four MSB thresholds denoted $\{RV_{31}, RV_{33}, RV_{35}, RV_{37}\}$. In the present example, processor 48 reads the MSB page twice using two sets of explicit read thresholds denoted TH1, TH2. Processor 48 divides the memory cells in the group into four subsets denoted V1 . . . V4 based on the readout results of the LSB and CSB pages.

Processor 48 calculates a total of eight partial syndromes. Each partial syndrome is calculated using the readout results obtained using one of the two sets of explicit read thresholds from one of the four subsets of memory cells (V1 . . . V4). The eight partial syndromes are stored in memory, and the raw readout results are typically discarded.

In the present example, processor 48 comprises four syndrome memories 70A . . . 70D for storing the partial syndromes corresponding to subsets V1 . . . V4. Memory 70A thus stores two partial syndromes denoted TH1V1 (calculated on the readout results read from subset V1 using thresholds TH1 with the other results nullified) and TH2V1 (calculated on the readout results read from subset V1 using thresholds TH2 with the other results nullified). Similarly, memory 70B stores partial syndromes TH1V2 and TH2V2, memory 70C stores partial syndromes TH1V3 and TH2V3, and memory 70D stores partial syndromes TH1V4 and TH2V4.

Using these partial syndromes, processor 48 is able to evaluate the syndrome sum of $2^4=16$ sets (explicit and hybrid) of read thresholds. Each set corresponds to four partial syndromes—one selected from each syndrome memory. The syndrome sum of a given read threshold set is calculated by performing bit-wise XOR (i.e., summing modulo 2) on the four partial syndromes corresponding to this set, and then counting the number of "1"s in the XOR result.

In the example of FIG. 3, processor 48 comprises a XOR unit 74 that receives four partial syndromes from memories 70A . . . 70D, respectively, and performs bit-wise XOR on the four partial syndromes. The processor then sums the "1"s in the XOR result. The sum of "1"s, which is the syndrome sum, is stored as a respective entry 82 in a syndrome sum memory 78. This process is typically repeated for the $2^4=16$ possible combinations of partial syndromes.

Processor 48 then finds the smallest entry 82 in memory 78, i.e., the minimal syndrome sum. Processor 48 selects the read threshold set (hybrid or explicit) corresponding to this minimal syndrome sum as the optimal set of read thresholds. As explained above, processor 48 may not necessarily pick the minimal syndrome sum, and may generally find the desired set of read thresholds from the syndrome sums in any other suitable way.

Efficient Selection of Optimal Read Thresholds Using Partial Syndrome Combination Histogram As can be appreciated, finding the minimal syndrome sum using the configuration of FIG. 3 above involves a large number of computations, and in particular a large number of readout operations from memories 70A . . . 70D. Since each partial syndrome participates in the evaluation of multiple threshold sets (explicit and hybrid), each partial syndrome is read from memory multiple times.

In some embodiments, processor 48 uses an alternative scheme, described in FIGS. 4 and 5 below, which calculates the minimal syndrome sum and selects the optimal read thresholds while reading each partial syndrome only once.

Figure 4:
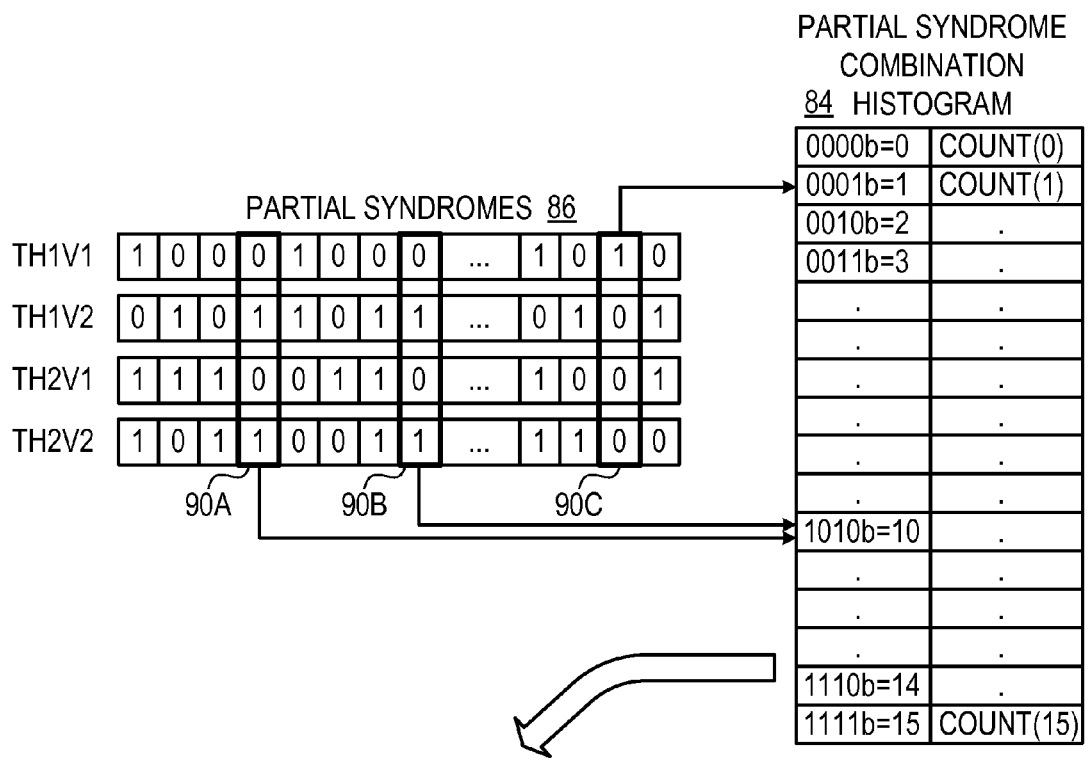

FIG. 4 is a diagram that schematically illustrates a process for calculating optimal read thresholds, in accordance with an embodiment of the present invention. In the example of FIG. 4, memory cells 32 comprise 2 bits/cell MLC, for the sake of clarity. In alternative embodiments, the scheme of FIG. 4 can be used with any other suitable type of analog memory cells, such as eight-level or sixteen-level MLC.

In the present example, processor 48 calculates the minimal syndrome sum in order to select optimal read thresholds for reading the MSB page from a group of memory cells 32, typically along a word line. Processor 48 divides the memory cells in the group into two subsets, e.g., based on the readout results of the LSB page stored in the group. The two subsets are denoted V1 and V2. Processor 48 reads the MSB page using two explicit sets of read thresholds denoted TH1 and TH2.

Thus, processor 48 produces a total of four partial syndromes 86 denoted TH1V1, TH1V2, TH2V1 and TH2V2. Each partial syndrome 86 comprises multiple bits at respective bit positions. In each bit position, the four bits of the four respective partial syndromes form a certain four-bit combination. Three example combinations 90A . . . 90C are marked in the figure.

Processor 48 constructs a histogram 84 that counts the four-bit combinations that occur in the various bit positions of partial syndromes 86. Histogram 84 comprises sixteen bins corresponding to the sixteen possible four-bit combinations. For the sake of clarity, each four-bit combination is viewed as a binary number, and this number corresponds to the index of the bin in the histogram.

In other words, the $k^{th}$ bin in histogram 84 (denoted i COUNT(k) or C(k), k=0 . . . 15) counts the number of times that the four-bit combination equal to decimal k occurs in the partial syndromes. For example, combinations 90A and 90B in the figure are both "1010", i.e., decimal 10, and therefore both contribute to the count in bin C(10) of the histogram. Combination 90C in the figure is "0001", and therefore contributes to bin C(1) of the histogram.

Processor 48 may construct histogram 84, for example, by scanning the partial syndromes and incrementing the appropriate bins per each four-bit combination. Note that processor 48 builds the histogram by reading each partial syndrome only once. After the histogram is ready, the partial syndromes may be discarded.

After preparing histogram 84, processor 48 uses the histogram to calculate the syndrome sums of the four possible sums of the partial syndromes (TH1V1+TH2V1, TH1V1+TH2V2, TH1V2+TH2V1 and TH1V2+TH2V2). It can be seen that each sum of partial syndromes is affected by a predefined subset of the histogram bins.

Consider, for example, the sum TH1V1+TH2V1. The summation of the partial syndromes is modulo 2, i.e., bit-wise XOR. Thus, this sum is affected only by the four-bit combinations in which the XOR between the first bit (taken from TH1V1) and the third bit (taken from TH2V1) is "1". In other words, each four-bit combination that occurs in the partial syndromes, in which the first OR third bit (but not both) is "1", will increment the syndrome sum of TH1V1+TH2V1 by one. The total number of these four-bit combinations is equal to the sum of eight bins of histogram 84, namely C(1)+C(3)+C(9)+C(11)+C(4)+C(6)+C(14)+C(12). The other three syndrome sums can also be expressed as a summation over predefined subsets of the histogram bins.

Thus, in some embodiments processor 48 calculates each of the four possible syndrome sums by summing the appropriate subset of bins of histogram 84. Then, processor 48 finds the smallest syndrome sum among the four, and selects the corresponding set of read thresholds (explicit or hybrid) as the optimal set of read thresholds.

In an alternative embodiment, memory cells 32 comprise 3 bits/cell MLC, and the MSB page is read using four read thresholds. With three possible values for each read threshold, the size of the histogram is $2^{12}$. The number of threshold combinations is $3^4$. If relative partial syndromes are used, the histogram size is reduced to $2^9$. Generating a histogram (performing one pass over the syndromes) and then generating the syndrome sum (performing one pass over the histogram) can be more efficient then scanning all the possible combinations using the raw data or the partial syndromes.

Figure 5:
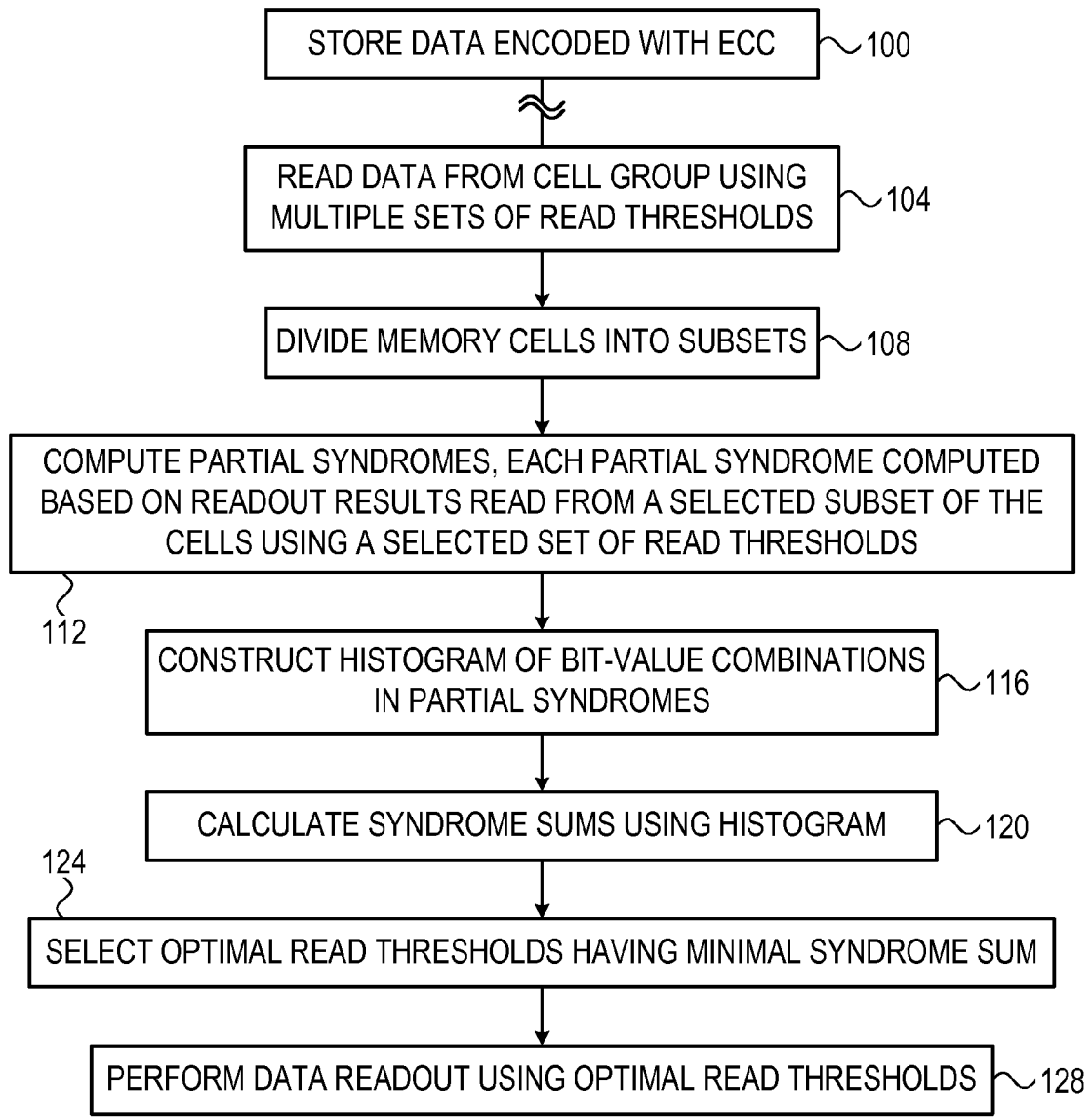
FIG. 5 is a flow chart that schematically illustrates a method for calculating optimal read thresholds, in accordance with an embodiment of the present invention.

FIG. 5 is a flow chart that schematically illustrates a method for calculating optimal read thresholds, in accordance with an embodiment of the present invention. The method begins with processor 48 storing ECC-encoded data in a group of memory cells 32, at a storage step 100.

At a certain point in time, processor 48 reads the MSB page from the memory cells in the group using multiple sets of read thresholds, at a readout step 104. Processor 48 divides the memory cells in the group into subsets based on the LSB readout results, at a division step 108.

Processor 48 then computes the partial syndromes based on the readout results of step 104, at a partial syndrome computation step 112. Processor 48 computes each partial syndrome over the MSB readout results obtained from a respective subset of the memory cells using a respective set of read thresholds. The partial syndrome is thus associated with the threshold set and the subset of cells over which it was calculated.

At a histogram construction step 116, processor 48 constructs histogram 84 of the bit-value combinations occurring in the various bit positions in the partial syndromes. At a syndrome sum calculation step 120, processor 48 calculates multiple syndrome sums for multiple sums of partial syndromes. Each syndrome sum is calculated by summing a respective predefined subset of histogram bins, which are known to contribute to that syndrome sum.

At a threshold selection step 124, processor 48 selects the read threshold set corresponding to the minimal syndrome sum out of the syndrome sums calculated at step 120 above. This set of read thresholds is regarded as the optimal set. Processor 48 performs data readout using the selected optimal threshold set, at a data readout step 128. The processor may use the optimal read thresholds for reading the same group of memory cells used for selecting the thresholds, or a different group.

In the example of FIG. 4 above, the mapping of four-bit combinations into bin index was the following:

$$\text{Bin index} = 2^0 \cdot TH1V1 + 2^1 \cdot TH1V2 + 2^2 \cdot TH2V1 + 2^3 \cdot TH2V2$$

In alternative embodiments, any other suitable mapping can be used. In particular, it is possible to reduce the histogram size in half by encoding the relative bit-wise XORs between pairs of partial syndromes instead of the partial syndromes themselves. For example, an alternative mapping of four-bit combinations into bin index is:

$$\text{Bin index} = 2^0(TH1V1 \text{ XOR } TH2V1) + 2^1(TH1V2 \text{ XOR } TH1V1) + 2^2(TH2V2 \text{ XOR } TH2V1)$$

These relative bit-wise XORs are referred to herein as relative partial syndromes. In some embodiments, processor 48 may calculate the relative partial syndromes directly from the readout results (e.g., at step 112 of FIG. 5) instead of calculating the partial syndromes and the relative partial syndromes.

Partial Syndrome Calculation Unit Configurations

As explained above, a partial syndrome is defined as the ECC parity check matrix multiplied by a bit vector that is restricted to one lower-level programming state that is mapped to "1"s. The programming state used for the restriction corresponds to a lower-level page referred to as a separating page. In FIG. 2, for example, the LSB page is used as a separating page for partial syndrome calculations for the MSB page.

The bit vector (to be multiplied by the parity check matrix for producing the partial syndrome) is typically generated by masking the readout result vector with a combination of the separating pages and their complements.

Consider, for example, a group of 3 bits/cell MLC that store an LSB page, a CSB page and an MSB page. In this example, processor 48 calculates partial syndromes for setting the optimal set of four MSB read thresholds. The separating pages are the LSB and CSB readout results.

The partial syndromes in this case are obtained by calculating MSB&CSB&LSB, MSB&(NOT CSB)&LSB, etc. (wherein "&" denotes logical AND). The relative partial syndromes with respect to a data vector p are obtained by calculating (MSB^p)&CSB&LSB, (MSB^p)&(Not CSB)&LSB, etc., wherein "&" denotes bit-wise AND, and "^" denotes bit-wise XOR.

Figure 6A:
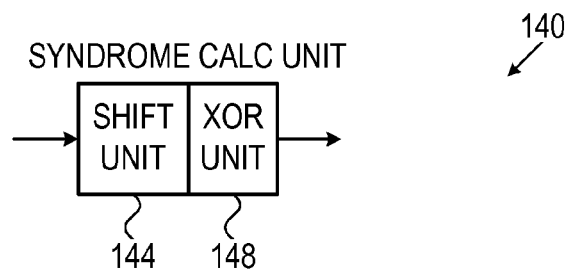
FIGS. 6A, 6B and 7 are block diagrams that schematically illustrate syndrome calculation units, in accordance with embodiments of the present invention.
Figure 6B:
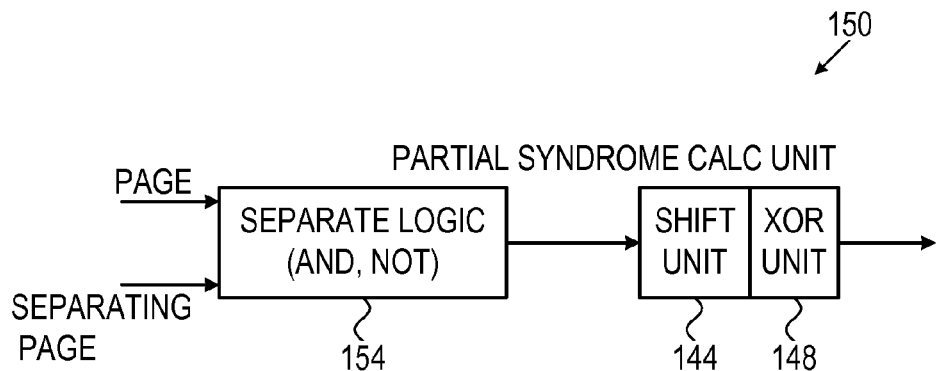
Figure 7:
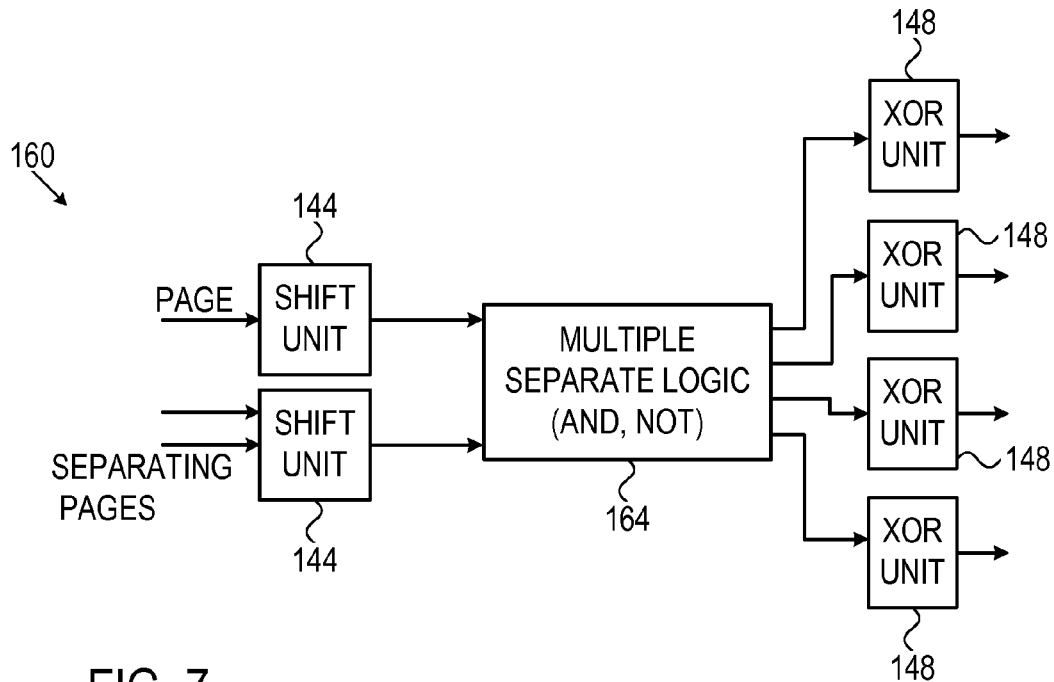

FIGS. 6A, 6B and 7 are block diagrams that schematically illustrate syndrome calculation units that can be implemented as part of processor 48, in accordance with embodiments of the present invention.

FIG. 6A shows a syndrome calculation unit 140, which calculates an ECC syndrome using a cascade of a shift unit 144 that performs shift operations, and a XOR unit 148 that performs XOR operations on the output of the shift unit.

FIG. 6B shows a partial syndrome calculation unit 150. Unit 150 accepts as input the readout results (denoted "PAGE"—the MSB readout result page in the above example), and the separating page (combination of the LSB and CSB pages in the above example). A logic unit 154 performs the appropriate AND and NOT logical operations on the input pages, and the output of unit 154 is provided to a cascade of shift unit 144 and XOR unit 148.

In some embodiments, processor 48 accelerates the syndrome calculation process by duplicating at least parts of the partial syndrome calculation unit, thus calculating the partial syndromes in parallel. Moreover, in some embodiments the parallelism factor can be reduced without performance degradation. In other words, by careful design, e.g., by splitting the syndrome calculation unit into separate shift and XOR units, it is possible to duplicate less hardware for the same level of parallelism.

FIG. 7 shows a partial syndrome calculation unit 160. This unit calculates partial syndromes for four read thresholds and three pages (one data page and two separating pages, as in the eight-level examples above). Unit 160 comprises two shift units 144, a logic unit 164 and four XOR units 148. Because unit 160 is split into separate shift and XOR units, shift unit 144 can be parallelized by a factor of three (one receiving the data page and the other receiving two separating pages), and only XOR unit 148 has to be parallelized by a factor of four.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
    storing data that is encoded with an Error Correction Code (ECC) in a group of memory cells;
    reading the memory cells in the group using multiple sets of read thresholds;
    dividing the memory cells in the group into two or more subsets;
    computing a plurality of partial syndromes of the ECC, wherein each partial syndrome is computed over readout results that were read using a respective set of the read thresholds from a respective subset of the memory cells;
    determining a number of occurrences for each combination of a plurality of bit values, wherein the plurality of bit values includes a bit value from a given bit position from each partial syndrome of the plurality of partial syndromes;
    calculating an optimal set of read thresholds dependent upon on the number of occurrences for each combination of the plurality of bit values; and
    performing data recovery using the optimal read thresholds.

2. The method according to claim 1, wherein calculating the optimal set of read thresholds comprises calculating, using the number of occurrences for each combination of the plurality of bit values, sums of different respective combinations of the partial syndromes, identifying a sum containing a minimal number of "1" bit values, and selecting the optimal read thresholds corresponding to the partial syndromes in the identified sum.

3. The method according to claim 1, wherein calculating the sums comprises, for a given sum, identifying the combinations of the plurality of bit values that contribute to the number of "1" bit values in the given sum, and summing the number of occurrences corresponding to the identified combinations.

4. The method according to claim 1, wherein computing the partial syndromes comprises storing the partial syndromes in a syndrome memory, and wherein determining the number of occurrences and calculating the optimal set comprise reading each partial syndrome from the syndrome memory only once.

5. The method according to claim 1, wherein determining the number of occurrences comprises producing relative partial syndromes that comprise bit-wise XORs of pairs of the partial syndromes.

6. The method according to claim 1, wherein computing the partial syndromes comprises computing, directly from the readout results, relative partial syndromes that comprise bit-wise XORs of pairs of the partial syndromes.

7. The method according to claim 1, wherein computing the plurality of partial syndromes comprises performing logical shift operations, followed by performing XOR operations.

8. An apparatus, comprising:
    a memory, including memory cells; and
    storage circuitry, which is configured to:
    store data that is encoded with an Error Correction Code (ECC) in a group of the memory cells;
    read the memory cells in the group using multiple sets of read thresholds;
    divide the memory cells in the group into two or more subsets;
    compute a plurality of partial syndromes of the ECC, wherein each partial syndrome is computed over readout results that were read using a respective set of the read thresholds from a respective subset of the memory cells;
    determine a number of occurrences for each combination of a plurality of bit values, wherein the plurality of bit values include a bit value from a given bit position from each partial syndrome of the plurality of partial syndromes;
    calculate an optimal set of read thresholds based on the counts; and
    perform data recovery using the optimal read thresholds.

9. The apparatus according to claim 8, wherein the storage circuitry is configured to calculate, using the number of occurrences, sums of different respective combinations of the plurality of bit values, to identify a sum containing a minimal number of "1" bit values, and to select the optimal read thresholds corresponding to the partial syndromes in the identified sum to serve as the optimal set.

10. The apparatus according to claim 8, wherein the storage circuitry is configured to calculate a given sum by identifying the combinations of the plurality of bit values that contribute to the number of "1" bit values in the given sum, and to sum the number of occurrences corresponding to the identified combinations.

11. The apparatus according to claim 8, wherein the storage circuitry is configured to store the partial syndromes in a syndrome memory, and to determine the number of occurrences counts and calculate the optimal set by reading each partial syndrome from the syndrome memory only once.

12. The apparatus according to claim 8, wherein the storage circuitry is further configured to produce relative partial syndromes that comprise bit-wise XORs of pairs of the partial syndromes.

13. The apparatus according to claim 8, wherein the storage circuitry is further configured to compute, directly from the readout results, relative partial syndromes that comprise bit-wise XORs of pairs of the partial syndromes.

14. The apparatus according to claim 8, wherein the storage circuitry comprises one or more shift units for performing logical shift operations followed by one or more XOR units for performing XOR operations.

15. An apparatus, comprising:
   an interface, which is configured to communicate with a memory that includes memory cells; and
   storage circuitry, which is configured to:
   store data that is encoded with an Error Correction Code (ECC) in a group of the memory cells;
   read the memory cells in the group using multiple sets of read thresholds;
   divide the memory cells in the group into two or more subsets;
   compute a plurality of partial syndromes of the ECC, wherein each partial syndrome is computed over readout results that were read using a respective set of the read thresholds from a respective subset of the memory cells;
   determine a number of occurrences for each combination of a plurality of bit values, wherein the plurality of bit values include a bit value from a given bit position from each partial syndrome of the plurality of partial syndromes;
   calculate an optimal set of read thresholds based on the counts; and
   perform data recovery using the optimal read thresholds.

16. The apparatus according to claim 15, wherein the storage circuitry is configured to calculate, using the number of occurrences, sums of different respective combinations of the plurality of bit values, to identify a sum containing a minimal number of "1" bit values, and to select the optimal read thresholds corresponding to the partial syndromes in the identified sum to serve as the optimal set.

17. The apparatus according to claim 15, wherein the storage circuitry is further configured to calculate a given sum by identifying the combinations of the plurality of bit values that contribute to the number of "1" bit values in the given sum, and to sum the number of occurrences corresponding to the identified combinations.

18. The apparatus according to claim 15, wherein the storage circuitry is further configured to produce relative partial syndromes that comprise bit-wise XORs of pairs of the partial syndromes, and to determine the number of occurrences for respective combinations of the plurality of values.

* * * * *

UNITED STATES PATENT AND TRADEMARK OFFICE
CERTIFICATE OF CORRECTION

PATENT NO. : 8,869,008 B2  
APPLICATION NO. : 13/743721  
DATED : October 21, 2014  
INVENTOR(S) : Barak Baum et al.

It is certified that error appears in the above-identified patent and that said Letters Patent is hereby corrected as shown below:

In the Claims:

Claim 11, Column 16, Line 61, please delete "counts"

Signed and Sealed this  
Tenth Day of February, 2015

Michelle K. Lee  
*Deputy Director of the United States Patent and Trademark Office*